US012761260B2

(12) United States Patent
Schemel

(10) Patent No.: US 12,761,260 B2
(45) Date of Patent: Oct. 13, 2026

(54) METHOD FOR DETERMINING A CAPACITANCE OF A CAPACITOR, CAPACITOR MONITORING DEVICE AND SYSTEM

(71) Applicant: SKELETON TECHNOLOGIES GMBH, Großröhrsdorf (DE)

(72) Inventor: Bertram Schemel, Berlin (DE)

(73) Assignee: SKELETON TECHNOLOGIES GMBH (DE)

( * ) Notice: Subject to any disclaimer, the term of this patent is extended or adjusted under 35 U.S.C. 154(b) by 168 days.

(21) Appl. No.: 18/757,782

(22) Filed: Jun. 28, 2024

(65) Prior Publication Data

US 2025/0004029 A1 Jan. 2, 2025

(30) Foreign Application Priority Data

Jun. 30, 2023 (EP) .................................... 23182613

(51) Int. Cl.

*G01R 31/01* (2020.01)
*G01R 27/26* (2006.01)
*G01R 31/367* (2019.01)
*G01R 31/382* (2019.01)

(52) U.S. Cl.

CPC ....... *G01R 31/016* (2013.01); *G01R 27/2605* (2013.01); *G01R 31/367* (2019.01); *G01R 31/382* (2019.01)

(58) Field of Classification Search

CPC ......................... G01R 27/2605; G01R 31/382; G01R 31/367; G01R 31/016; G01R 31/64

See application file for complete search history.

(56) References Cited

U.S. PATENT DOCUMENTS 9,171,679 B2 * 10/2015 Gogotsi ................. H01G 11/62
9,989,595 B1 * 6/2018 Wang ................. G01R 31/3648

FOREIGN PATENT DOCUMENTS

| | | | |
|---|---|---|---|
| CN | 104297578 | A | 1/2015 |
| CN | 107255757 | A | 10/2017 |
| CN | 110389258 | A | 10/2019 |
| CN | 115542016 | A | 12/2022 |
| JP | 2016217951 | A | 12/2016 |

OTHER PUBLICATIONS

Ceraolo M. et al: "State-Of-Charge Evaluation Of Supercapacitors", Journal of Energy Storage; vol. 11, Jun. 1, 2017, pp. 211-218, XP093103927; NL ISSN: 2352-152X, DOI: 10.1016/j.est.2017.03.001.

Extended European Search Report corresponding to EP 23182613.2-1001 dated Jan. 2, 2024.

* cited by examiner

*Primary Examiner* — Tung X Nguyen
(74) *Attorney, Agent, or Firm* — Barnes & Thornburg LLP

(57) ABSTRACT

A method for determining a capacitance of a capacitor includes measuring an electrical current supplied from or to the capacitor over time, integrating the electrical current to determine a charge amount supplied from or to the capacitor over time, determining a state of charge, SoC, of the capacitor over time, determining a total charge capacity of the capacitor based on a linear relationship between changes in the charge amount and changes in the SoC, and determining the capacitance based on the calculated total charge capacity.

20 Claims, 7 Drawing Sheets

METHOD FOR DETERMINING A CAPACITANCE OF A CAPACITOR, CAPACITOR MONITORING DEVICE AND SYSTEM

CROSS REFERENCE AND PRIORITY CLAIM

This patent application claims priority to European Patent Application No. 23 182 613.2, filed Jun. 30, 2023, the disclosure of which is incorporated herein by reference in its entirety.

TECHNICAL FIELD

The present invention relates to method for determining a capacitance of a capacitor, a capacitor monitoring device and a system comprising the latter.

BACKGROUND

Capacitors are used in various applications requiring many rapid charge and discharge cycles. As an example, capacitors may be used in automobiles, buses, trucks, trains, ships, industrial robots, cranes, elevators, and the like, where they are used for regenerative braking, short-term energy storage, or burst-mode power delivery. As another example, capacitors may be mounted on printed circuit boards where they may be used to absorb spikes in power delivered to an electronic component, thereby creating a constant steady stream of electricity required to power the electronic component.

The properties of capacitors allow them to accept and deliver electric charge much faster compared to batteries, and to tolerate many more charge and discharge cycles compared to rechargeable batteries. One important property of capacitors is the capacitance. The capacitance, having SI units of Farad (F), is commonly expressed as the ratio of an (electric) charge stored by the capacitor and a difference in electric potential between the two terminals of the capacitor. The difference in electrical potential between the two terminals of the capacitor when disconnected from any circuit for a sufficient period of time is referred to as open-circuit voltage, OCV.

However, it can be observed that when a capacitor is charged with a constant current, the linear relationship between the electric charge stored by the capacitor and the open-circuit voltage is not perfectly satisfied. This non-linear behavior can be observed in a so-called OCV curve in which the open-circuit voltage is plotted against the state of charge, SoC, of the capacitor. The SoC may specify an amount of electric charge stored by the capacitor relative to a maximum electric charge capacity of the capacitor. FIG. 1 illustrates an example for an OCV curve of a capacitor, wherein a non-linear behavior can be observed.

In the state of the art, the capacitance is commonly modelled to be dependent on the open-circuit voltage by using a time-discrete numerical model, wherein the electric charge stored by the capacitor is measured at a plurality of measurement times during a charging or discharging cycle of the capacitor by integrating the current supplied to or provided by the capacitor. Then, the capacitance and open-circuit voltage at a measurement time is calculated based on the corresponding calculation of the open-circuit voltage at the preceding measurement time.

SUMMARY

The above-described conventional method of modelling a capacitor may have the problem that deviations of the open-circuit voltage calculated at one measurement time from the actual value may accumulate over time, due to the reliance on the open-circuit voltage calculated at the preceding measurement time. Furthermore, by modelling the capacitance to be dependent on the open-circuit voltage, the determined capacitance is not constant but may take multiple values. Thus, the capacitance determined in such a manner may lack reliability.

Hence, there is a need for a robust method of determining a capacitance of a capacitor with improved reliability.

One embodiment relates to a method for determining a capacitance of a capacitor, the method comprising: measuring an electrical current supplied from or to the capacitor over time; integrating the electrical current to determine a charge amount supplied from or to the capacitor over time; determining a state of charge, SoC, of the capacitor over time; determining a total charge capacity of the capacitor based on a linear relationship between changes in the charge amount and changes in the SoC; and determining the capacitance based on the calculated total charge capacity.

Further preferred embodiments are defined in the dependent claims.

DETAILED DESCRIPTION

The present invention shall now be described in conjunction with specific embodiments. The specific embodiments serve to provide the skilled person with a better understanding but are not intended to in any way restrict the scope of the invention, which is defined by the appended claims. In particular, the embodiments described independently throughout the description can be combined to form further embodiments to the extent that they are not mutually exclusive.

Figure 2:
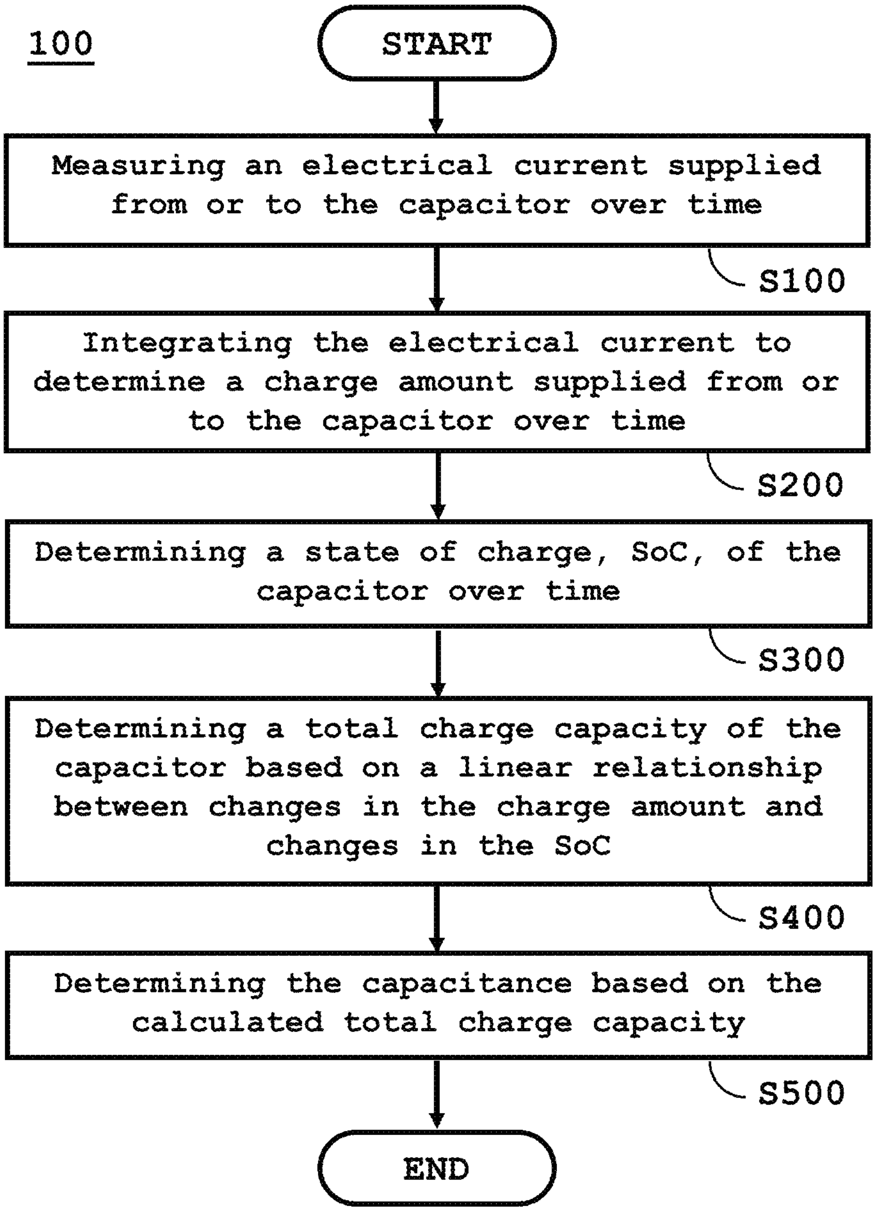
FIG. 2 shows a flow chart for a method of determining the capacitance of a capacitor.

FIG. 2 shows a flow chart for a method 100 of determining the capacitance of a capacitor. The method 100 comprises the steps S100, S200, S300, S400, and S500. The method 100 may be applied for a capacitor of any type. As an example, the capacitor may be a plate capacitor, a film capacitor, a ceramic capacitor, and the like. A capacitor within the meaning of the present application is any device that primarily stores electrical energy in an electric field by accumulating electric charges on opposing surfaces that are insulated from each other. Capacitors exhibit a predominately linear relationship between their stored electric charge and open-circuit voltage. The term capacitor thus excludes rechargeable batteries and accumulators. Furthermore, the term capacitor may relate to a single physical unit or to a plurality of physical units interconnected to act as a system for storing electrical energy in electric fields, e.g. an array of individual capacitor elements connected in parallel or in series.

The capacitor may be a supercapacitor. A synonymous expression is ultracapacitor. The term supercapacitor is preferably understood to extend to any capacitor that fulfills one or more of the following criteria: a) a maximum capacitance in excess of 10 F, preferably in excess of 100 F, more preferably in excess of 1000 F; b) a specific energy (expressed in watt-hours (Wh) per device weight in kilogram (kg)) in excess of 1 Wh/kg, preferably in excess of 5 Wh/kg, more preferably in excess of 10 Wh/kg. The supercapacitor may, for example, be an electrochemical double-layer capacitor which stores energy in an electric field of the electrochemical double-layer. The electrochemical double-layer capacitor may comprise two electrodes and an electrolyte, wherein the electrochemical double-layer is formed within the electrolyte on a surface of each of the electrodes when a voltage is applied to the electrodes. The electrodes may comprise porous conductive active materials such as activated carbon. The electrolyte may comprise a solvent and a salt.

In step S100, an electrical current supplied from or to the capacitor is measured over time. The electrical current has SI units of ampere (A). The electrical current may be associated with an uncertainty.

The measuring in step S100 may be performed in a time-discrete manner. The electrical current supplied from or to the capacitor may be measured at each of a plurality of measurement times. The plurality of measurement times may form a time series of measurements. As an example, the electrical current may be measured over a time of 10 s during which the capacitor is charged or discharged. The time period between each of the plurality of measurement times may be referred to as a measurement interval. As an example, the electrical current may be measured every 50 ms, i.e. at a measurement rate of 20 Hz.

As an example, let N be the number of measurements of the electrical current over time, i.e. the electrical current supplied from or to the capacitor over time. Then, at each measurement time tk (k being an integer, e.g. k=1, 2, . . . , N) of the plurality of measurement times, an electrical current I(tk) at that measurement time may be measured. The plurality of measurement results I(t1), I(t2), . . . , I(tN) may indicate the electrical current over time.

It should be noted that the number of measurement results may be less than N, i.e. less than the number of measurements. Such a situation may occur, for example, when measurement has failed or when a measurement result has been filtered out based on a data quality constraint, for example.

In step S200, the electrical current is integrated to determine a charge amount supplied from or to the capacitor over time. The charge amount refers to the amount of electric charge supplied from or to the capacitor. The charge amount may be associated with an uncertainty which is based on the uncertainty of the measurement of the electrical current.

The integration in step S200 may be performed in a time-discrete manner. In terms of the above example pertaining to N measurements of the electrical current over time, the charge amount over time may be indicated by a plurality of integration results Q(t1), Q(t2), . . . , Q(tN), wherein the charge amount Q(tk) at a measurement time tk may be computed as:

$$Q(tk) = Q(t0) + \int_{t_0}^{t_k} I(t)dt. \quad \text{[Equation 1]}$$

The initial charge amount Q(t0) at time to refers to the initial value of the amount of electric charge stored by the capacitor before electrical current is supplied from or to the capacitor. The initial charge amount Q(t0) may be determined in advance, for example, by fully discharging the capacitor such that Q(t0)=0. The capacitor may be determined to be fully discharged based on a measurement of the open-circuit voltage UOC. For a fully discharged capacitor, UOC equals (approximately) zero. The initial charge amount Q(t0) may correspond to the result of a previous iteration of the method 100 or at least of the steps S100 and S200.

Similarly, a change in the charge amount ΔQ(tk) at a measurement time tk may be computed as:

$$\Delta Q(tk) = \int_{t_{k-1}}^{t_k} I(t)dt. \quad \text{[Equation 2]}$$

In the above Equations 1 and 2, I(t) refers to the electrical current over time. I(t) may be derived based on the plurality of measurement results I(t1), I(t2), . . . , I(tN), for example, using a linear interpolation, a polynomial fit, and the like. Alternatively, I(t) may be a step function, wherein the electrical current in each measurement interval (tk−1, tk] is equal to the measurement I(tk) at measurement time tk. In this case, the above Equations 1 and 2 may be expressed in terms of a summation, i.e. respectively computed as:

$$Q(tk) = Q(t0) + \sum_{i=0}^{k} I(tk) \cdot (tk - tk - 1), \quad \text{[Equation 3]}$$

$$\Delta Q(tk) = I(tk) \cdot (tk - tk - 1). \quad \text{[Equation 4]}$$

In step S300, a state of charge, SoC, of the capacitor over time is determined. The SoC may specify an amount of electric charge stored by the capacitor relative to a maximum electric charge capacity of the capacitor and is usually given as a percentage value of the latter. The SoC may be associated with an uncertainty.

The determination in step S300 may be performed in a time-discrete manner. In terms of the above example pertaining to N measurements of the electrical current over time, the SoC over time may be indicated by a plurality of determination results SoC(t1), SoC(t2), . . . , SoC(tN). A change in the SoC, ΔSoC(tk), at a measurement time tk may be computed by taking the difference of SoCs at two successive measurement times tk−1 and tk, i.e. as SoC(tk)−SoC(tk−1). Thus, changes in the SoC over time may be indicated by a plurality of determination results ΔSoC(t1), ΔSoC(t2), . . . , ΔSoC(tN).

An initial SoC, SoC(t0), at time t0 refers to the initial value of the SoC of the capacitor before electrical current is supplied from or to the capacitor. The initial SoC, SoC(t0), may be determined in advance, for example, by fully discharging the capacitor such that SoC(t0)=0. The initial SoC, SoC(t0), may correspond to the result of a previous iteration of the method 100 or at least of the step S300.

In step S400, a total charge capacity of the capacitor is determined based on a linear relationship between changes in the charge amount and changes in the SoC. The total charge capacity Qmax may be a proportionality factor relating the changes in the SoC to the changes in the charge amount. The total charge capacity Qmax has SI units of Coulomb (C) but is usually given in units of ampere-hours (Ah). The total charge capacity Qmax may indicate the maximum electric charge capacity of the capacitor, i.e. the maximum amount of electric charge that can be stored by the capacitor.

According to an embodiment, the determining of the total charge capacity Qmax may comprise performing a least-squares regression based on measurement points associating changes in the charge amount with changes in the SoC. In terms of the above example pertaining to N measurements of the electrical current over time, the plurality of measurement points may be represented by a plurality of tuples (ΔSoC(t1), ΔQ(t1)), (ΔSoC(t2), ΔQ(t2)), . . . , (ΔSoC(tN), ΔQ(tN)).

Figure 3:
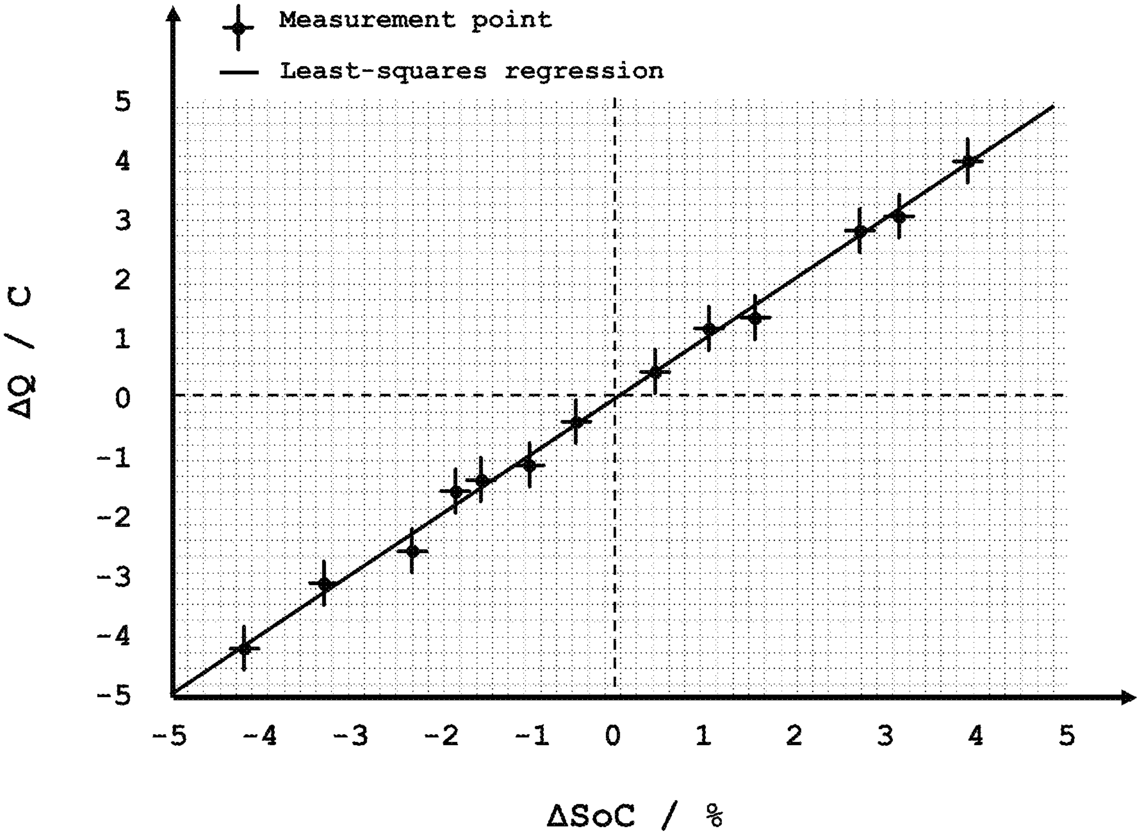
FIG. 3 shows an example of a plot of measurement points associating changes in the charge amount with changes in the SoC, and a linear relationship based on a least-squares regression.

FIG. 3 shows an example of a plot of the measurement points associating changes in the charge amount with changes in the SoC, and the linear relationship based on a least-squares regression. The linear relationship as indicated by the line may have a slope corresponding to the total charge capacity Qmax. Each of the measurement points (ΔSoC(tk), ΔQ(tk)) may be associated with the corresponding uncertainties of ΔSoC(tk) and ΔQ(tk) as indicated by the horizontal and vertical error bars, respectively.

Returning to the description of FIG. 2, in step S500, the capacitance is determined based on the calculated total charge capacity. The capacitance C, having SI units of Farad (F), may be expressed as the ratio of the total charge capacity Qmax and the open-circuit voltage UOC of the capacitor when fully charged, i.e. the maximum open-circuit voltage UOCmax. Thus, the capacitance C may be computed as:

$$C = Q\text{max}/UOC\text{max} \qquad \text{[Equation 5]}$$

Figure 4:
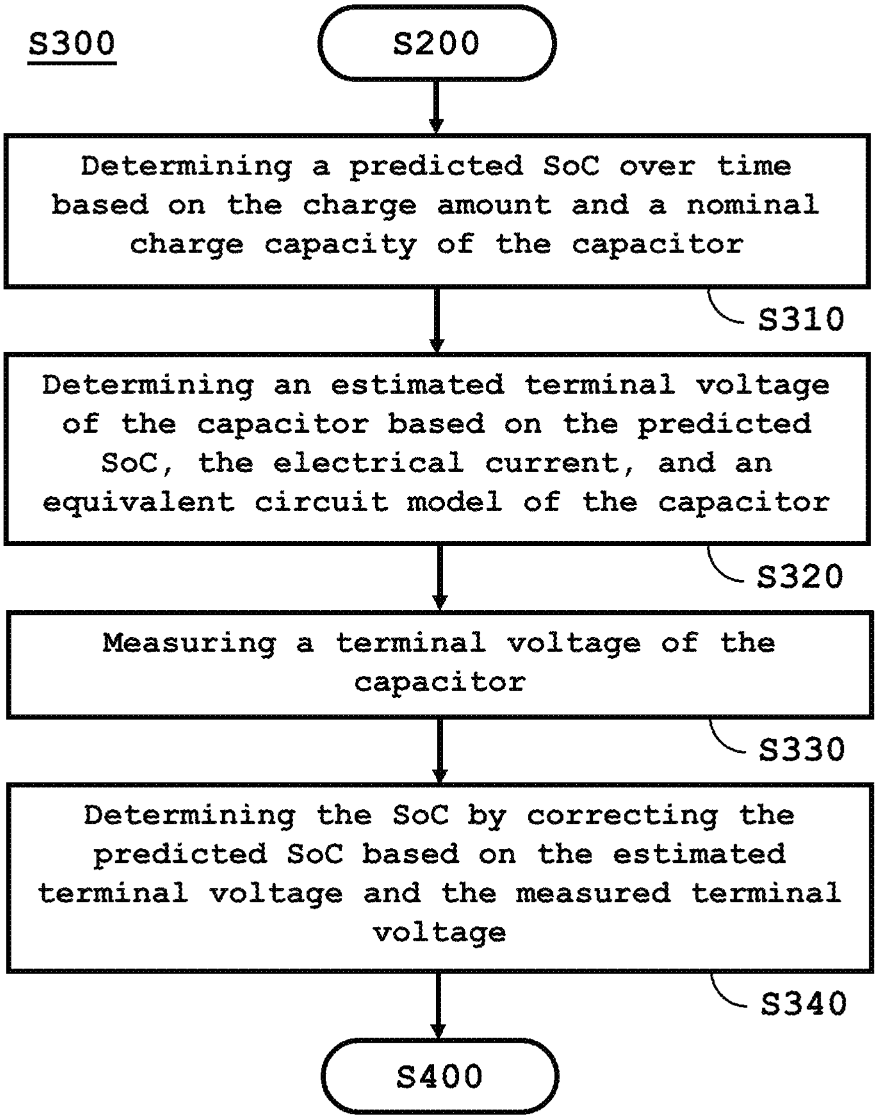
FIG. 4 shows further steps of determining the SoC.

According to an embodiment, the determining of the SoC in step S300 may further comprise the step S310, S320, S330, S340 as shown in FIG. 4.

In step S310, a predicted SoC may be determined over time based on the charge amount and a nominal charge capacity of the capacitor. The nominal charge capacity has SI units of Coulomb (C) but is usually given in units of ampere-hours (Ah). In the following, quantities determined based on a prediction or estimation are written with a hat (also referred to as a circumflex accent or caret), ^, on top. For instance, the predicted SoC is written as SôC, wherein the hat indicates that it is a prediction.

According to an embodiment, the nominal charge capacity may be determined in advance based on an amount of charge required for changing a terminal voltage of the capacitor between a minimum voltage value and a maximum voltage value, for example, between 0 V and 2.85 V. As an alternative, the nominal charge capacity may be determined based on the total charge capacity Qmax determined in a previous iteration of the method 100. As yet another alternative, the nominal charge capacity Qmax may be given by a rated charge capacity provided by a manufacturer of the capacitor.

The determination in step S310 may be performed in a time-discrete manner. In terms of the above example pertaining to N measurements of the electrical current over time, the predicted SoC over time may be indicated by a plurality of determination results SôC(t1), SôC(t2), . . . , SôC(tN). The predicted SoC, SôC(tk), at a measurement time tk may be computed by scaling (multiplying) the corresponding charge amount Q(tk) (see Equation 1 or 3) with 1/Qmax. Similarly, a change in the predicted SoC, ΔSôC(tk), at a measurement time tk may be computed by scaling (multiplying) the corresponding change in charge amount ΔQ(tk) (see Equation 2 or 4) with 1/Qmax. The calculation of the predicted SoC may include additional multiplicative factors of 100 and/or 1/3600 in order to express the predicted SoC in terms of a percentage value and/or convert ampere-hours to Coulomb.

In other words, the predicted SoC, SôC(tk), and the change in the predicted SoC, ΔSôC(tk), at the measurement time tk may be computed as:

$$S\hat{o}C(tk) = Q(tk)/(36\cdot Q\text{max}), \qquad \text{[Equation 6]}$$

$$\Delta S\hat{o}C(tk) = \Delta Q(tk)/(36\cdot Q\text{max}). \qquad \text{[Equation 7]}$$

Here, Q(tk) and ΔQ(tk) may be computed according to Equations 1 and 2, respectively, or according to Equation 3 and 4, respectively. The factor of 36 in the denominator may be used to units of Qmax from ampere-hours to Coulomb and to express SôC(tk) and ΔSôC(tk) as a percentage value.

In step S320, an estimated terminal voltage of the capacitor may be determined based on the predicted SoC, the electrical current, and an equivalent circuit model of the capacitor. In other words, the estimated terminal voltage of the capacitor may be determined over time during the charging and/or discharging of the capacitor and based on the predicted SoC, the electrical current, and the equivalent circuit model of the capacitor. The equivalent circuit model may be used to approximate the internal structure and dynamics of the capacitor using ideal electrical circuit components, such as resistors, inductors, and capacitors, connected in series and/or in parallel.

According to an embodiment, the equivalent circuit model may comprise an internal cell resistance of the capacitor. In the equivalent circuit model, the internal cell resistance may be an ideal resistor connected in series to an ideal capacitor. The internal cell resistance may be used to model the capacitor's internal opposition to a flow of the electric current supplied from or to the capacitor. The internal cell resistance may also be referred to as equivalent series resistance, ESR.

The terminal voltage refers to a voltage (potential difference) measured between the terminals (positive and negative terminals) of the capacitor when the capacitor is either connected to a load during discharging of the capacitor or to a power supply during charging of the capacitor. The terminal voltage may also be referred to as closed-circuit voltage, CCV.

The determination in step S320 may be performed in a time-discrete manner. In terms of the above example pertaining to N measurements of the electrical current over time, the estimated terminal voltage ÛCC(tk) at a measurement time tk may be estimated based on the open-circuit voltage ÛOC(tk), the electrical current I(tk) supplied from or to the capacitor, and the equivalent circuit model of the capacitor. The estimated terminal voltage over time may be indicated by a plurality of determination results ÛCC(t1), ÛCC(t2), . . . , ÛCC(tN).

For an equivalent circuit model comprising an internal cell resistance with a resistance value R having SI-unit of Ohm (Ω), the estimated terminal voltage UCC(tk) may be computed as:

$$\hat{U}CC(tk)=\hat{U}OC(tk)+R\cdot I(tk) \quad \text{[Equation 8]}$$

Figure 1:
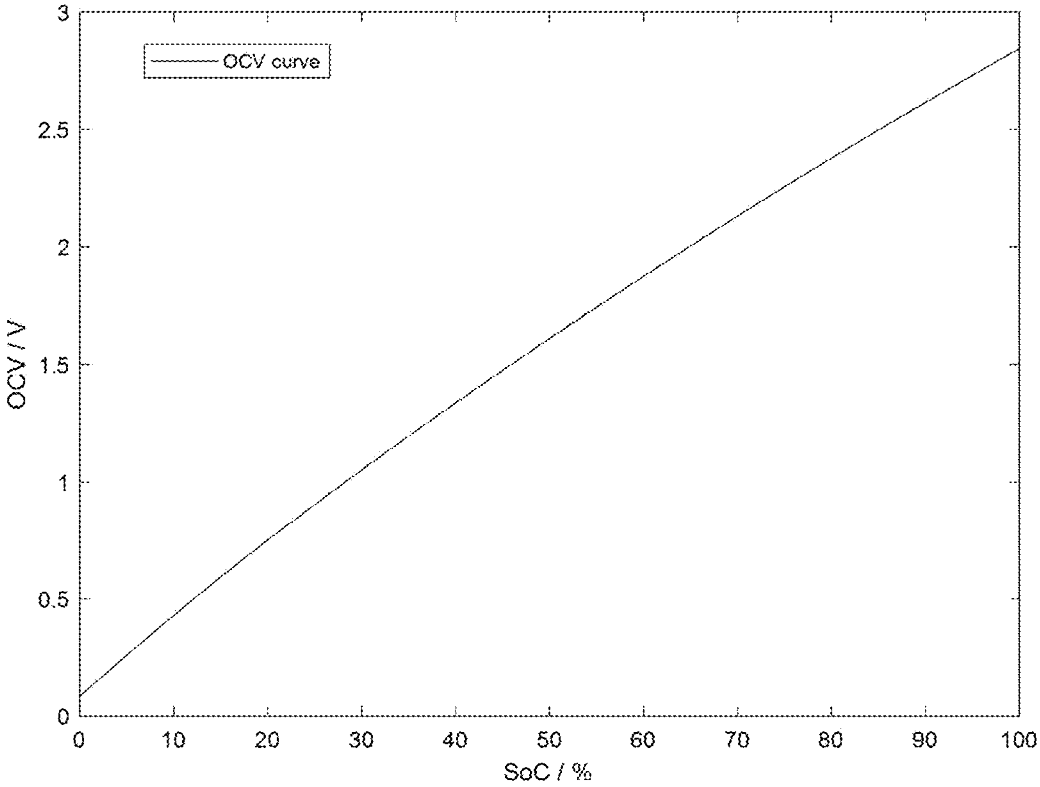
FIG. 1 shows a plot of an OCV curve for a capacitor.

According to an embodiment, the determining of the estimated terminal voltage may comprise determining an open-circuit voltage of the capacitor over time using a lookup table. The lookup table may map a value of the SoC to a corresponding value of the open-circuit voltage. In other words, the lookup table may be a predetermined mapping OCV(SoC) wherein the open-circuit voltage is a function of the SoC, wherein the SoC may be the predicted SoC, i.e. SôC may be used as the domain of the mapping, i.e. OCV(SoC) and OCV(SôC) correspond. The lookup table may be derived using a simulation and/or experimental data of the capacitor or another capacitor of identical construction. As an example, the lookup table may correspond to the plot shown in FIG. 1. Thus, the open-circuit voltage over time may be determined by mapping each value of the predicted SoC to a corresponding value of the open-circuit voltage according to the lookup table represented by the OCV curve.

According to an embodiment, the determining of the estimated terminal voltage may comprise measuring a temperature of the capacitor to determine one or more internal cell parameters. Internal cell parameters may be parameters associated with the equivalent circuit model of the capacitor. As an example, for an equivalent circuit model comprising an internal cell resistance, the one or more internal cell parameters may comprise the internal cell resistance R. The internal cell resistance R may be temperature dependent. Thus, by measuring the temperature of the capacitor, it is possible to adjust the equivalent circuit model to changes in the temperature.

Returning to the procedure S300 shown in FIG. 4, in step S330, a terminal voltage of the capacitor may be measured. In other words, terminal voltage of the capacitor may be measured over time during the charging and/or discharging of the capacitor. The measurement in step S330 may be performed in a time-discrete manner. In terms of the above example pertaining to N measurements of the electrical current over time, the terminal voltage over time may be indicated by a plurality of measurement results UCC(t1), UCC(t2), . . . , UCC(tN).

In step S340, the SoC may be determined by correcting the predicted SoC based on the estimated terminal voltage and the measured terminal voltage. As an example, the predicted SoC which is related to the estimated terminal voltage may be adjusted such that the estimated terminal voltage (approximately) matches the measured terminal voltage.

According to an embodiment, the correcting of the predicted SoC may be performed using an internal state estimation algorithm. The internal state estimated algorithm may be used to determine an internal state of the capacitor which is inaccessible to direct measurements. Such a state may also be referred to as a hidden state. The internal state estimation algorithm may be a Lueneberger observer algorithm. As an alternative, the internal state estimation algorithm may be a Kalman filter algorithm. In the following, an exemplary implementation of a Kalman filter algorithm for correcting the predicted SoC is described in terms of the above non-limiting example.

Figure 5:
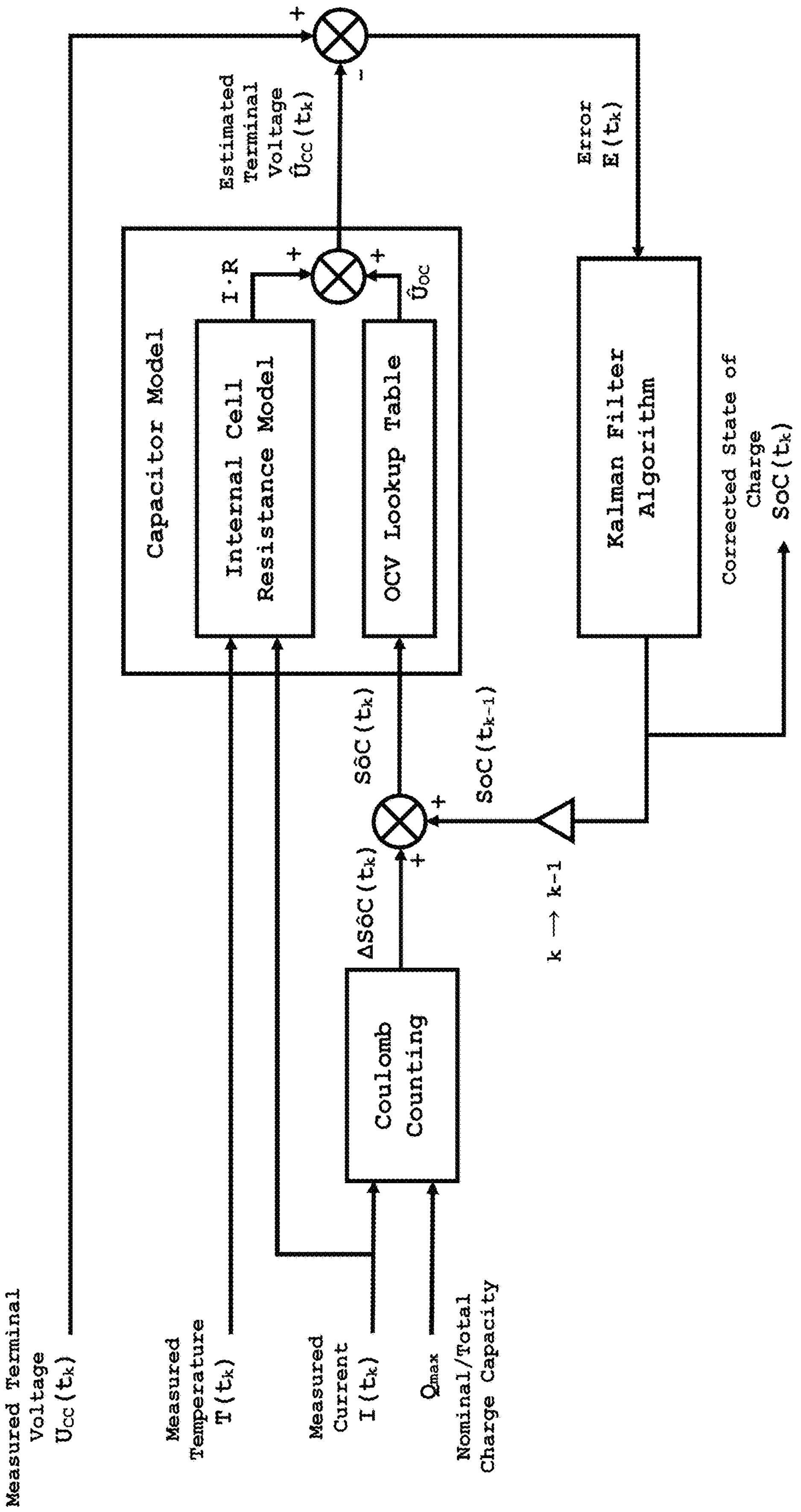
FIG. 5 shows a schematic diagram of a Kalman filter algorithm for determining the SoC of the capacitor.

FIG. 5 shows a schematic diagram of a Kalman filter algorithm for determining the SoC of the capacitor. The Kalman filter algorithm uses the correlations according to a given model between one or more directly measurable quantities, such as the terminal voltage, and one or more hidden (i.e. not directly measurable) quantities, such as the SoC, to correct the prediction for the one or more hidden quantities. For quantities evolving dynamically over time, the corrected prediction may be used in a subsequent iteration to refine the subsequent prediction.

At a measurement time tk, the measured electrical current I(tk) may be used to determine the corresponding change in the charge amount ΔQ(tk). The change in the charge amount ΔQ(tk) and the total charge capacity (which may be the total charge capacity Qmax determined in a previous iteration of the method 100) may then be used to determine change in the predicted SoC, ΔSôC(tk), at the measurement time tk. The change in the predicted SoC, ΔSôC(tk), may then be added to the change in the SoC, ΔSoC(tk−1) determined for the previous measurement time tk−1, in order to determine the predicted SoC, SôC(tk), at the measurement time tk.

Then, the predicted SoC, SôC(tk), at the measurement time tk may be used to determine the corresponding open-circuit voltage ÛOC(tk) using the lookup table. The electrical current I(tk) and the temperature T(tk) at the measurement time tk may be used to determine the product I(tk)·R(tk) wherein R(tk) refers to the temperature-dependent internal cell resistance. The open-circuit voltage ÛOC(tk) and the product I(tk)·R(tk) may then be added to determine the estimated terminal voltage ÛCC(tk) at the measurement time tk.

Then, the terminal voltage UCC(tk) at the measurement time tk may be compared with the estimated terminal voltage ÛCC(tk) in order to derive an error E(tk) of the estimation, i.e. the difference between ÛCC(tk) and UCC(tk). The error E(tk) may be fed into the Kalman filter algorithm to determine the corrected SoC(tk) at the measurement time tk. The corrected SoC(tk) may be used for the determining of the predicted SôC(tk) at the subsequent measurement time tk+1.

By performing repeated iterations of the Kalman filter algorithm, the (corrected) SoC over time may be determined. The method 100 may then proceed with steps S400 and S500 in which the corrected SoC is used to determine the capacitance of the capacitor.

Returning to the general embodiment of FIG. 2, the method 100 allows the determination of the capacitance of a capacitor at high precision. In this manner, it can be ensured that the capacitor can reliably perform its intended function within the application.

Figure 6:
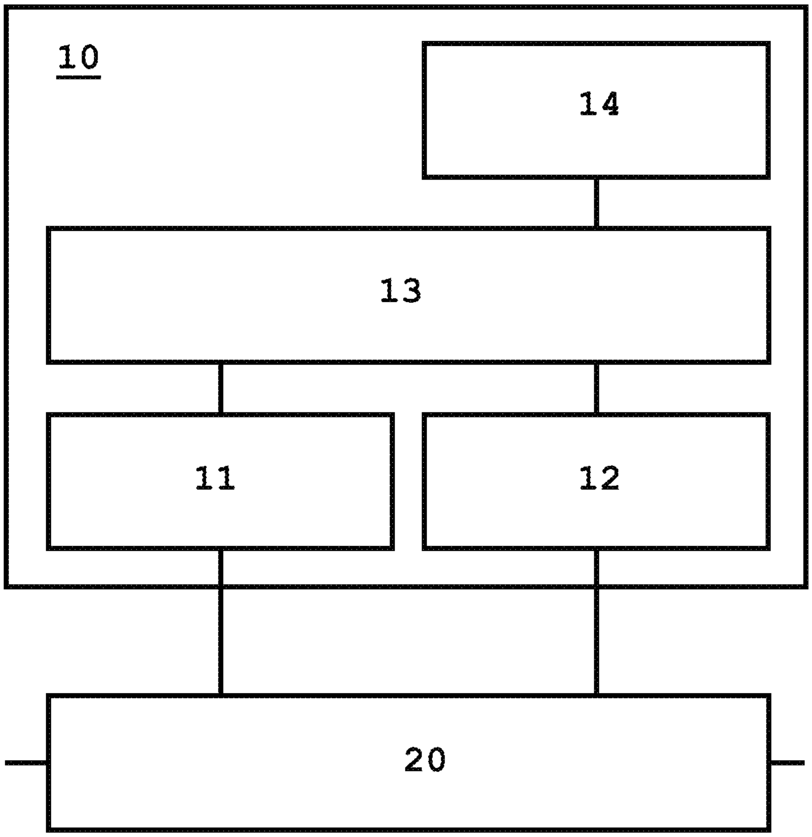
FIG. 6 shows a capacitor monitoring device for monitoring the capacitance of a capacitor.

The method 100 may be realized by a capacitor monitoring device 10 for monitoring the capacitance of a capacitor 20 as shown in the example FIG. 6. The capacitor monitoring device 10 may comprise a current sensor 11 configured to measure an electrical current supplied from or to the capacitor 20 over time, and a voltage sensor 12 configured to measure a terminal voltage of the capacitor 20 over time.

The capacitor monitoring device 10 may further comprise a capacitance determination unit 13 configured to perform the method 100 of any of the embodiments disclosed above. The capacitance determination unit 13 may be provided by a data processing apparatus which will be described with reference to the example of FIG. 7.

The capacitor monitoring device 10 may further comprise an output unit 14 configured to output the determined capacitance. As an example, the output unit 14 may be a gauge on which the determined capacitance is indicated by the position/orientation of a pointer. As another example, the output unit 14 may be a display screen on which the determined capacitance is displayed. As another example, the output unit 14 may be a storage medium to which the determined capacitance is outputted by storing the determined capacitance in a log file stored on a storage medium.

Figure 7:
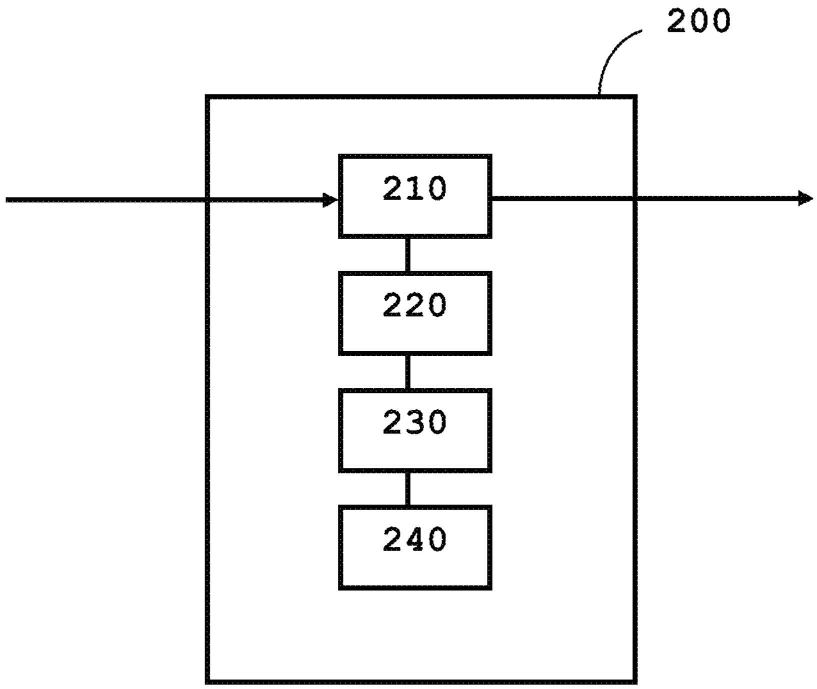
FIG. 7 shows a schematic illustration of a hardware structure of a data processing apparatus.

FIG. 7 is a schematic illustration of a hardware structure of a data processing apparatus 200 comprising means for carrying out the steps of the methods of any of the embodiments disclosed above.

The data processing apparatus 200 has an interface module 210 providing means for transmitting and receiving information. The data processing apparatus 200 has also a processor 220 (e.g. a CPU) for controlling the data processing apparatus 200 and for, for instance, process executing the steps of the methods of any of the embodiments disclosed above. It also has a working memory 230 (e.g. a random-access memory) and an instruction storage 240 storing a computer program having computer-readable instructions which, when executed by the processor 220, cause the processor 220 to perform the methods of any of the embodiments disclosed above.

The instruction storage 240 may include a ROM (e.g. in the form of an electrically erasable programmable read-only memory (EEPROM) or flash memory) which is pre-loaded with the computer-readable instructions. Alternatively, the instruction storage 240 may include a RAM or similar type of memory, and the computer-readable instructions can be input thereto from a computer program product, such as a computer-readable storage medium such as a CD-ROM, etc.

In the foregoing description, aspects are described with reference to several embodiments. Accordingly, the specification should be regarded as illustrative, rather than restrictive. Similarly, the figures illustrated in the drawings, which highlight the functionality and advantages of the embodiments, are presented for example purposes only. The architecture of the embodiments is sufficiently flexible and configurable, such that it may be utilized in ways other than those shown in the accompanying figures.

Software embodiments presented herein may be provided as a computer program, or software, such as one or more programs having instructions or sequences of instructions, included or stored in an article of manufacture such as a machine-accessible or machine-readable medium, an instruction store, or computer-readable storage device, each of which can be non-transitory, in one example embodiment. The program or instructions on the non-transitory machine-accessible medium, machine-readable medium, instruction store, or computer-readable storage device, may be used to program a computer system or other electronic device. The machine- or computer-readable medium, instruction store, and storage device may include, but are not limited to, floppy diskettes, optical disks, and magneto-optical disks or other types of media/machine-readable medium/instruction store/storage device suitable for storing or transmitting electronic instructions. The techniques described herein are not limited to any particular software configuration. They may find applicability in any computing or processing environment. The terms "computer-readable", "machine-accessible medium", "machine-readable medium", "instruction store", and "computer-readable storage device" used herein shall include any medium that is capable of storing, encoding, or transmitting instructions or a sequence of instructions for execution by the machine, computer, or computer processor and that causes the machine/computer/computer processor to perform any one of the methods described herein. Furthermore, it is common in the art to speak of software, in one form or another (e.g., program, procedure, process, application, module, unit, logic, and so on), as taking an action or causing a result. Such expressions are merely a shorthand way of stating that the execution of the software by a processing system causes the processor to perform an action to produce a result.

Some embodiments may also be implemented by the preparation of application-specific integrated circuits, field-programmable gate arrays, or by interconnecting an appropriate network of conventional component circuits.

Some embodiments include a computer program product. The computer program product may be a storage medium or media, instruction store(s), or storage device(s), having instructions stored thereon or therein which can be used to control, or cause, a computer or computer processor to perform any of the procedures of the example embodiments described herein. The storage medium/instruction store/storage device may include, by example and without limitation, an optical disc, a ROM, a RAM, an EPROM, an EEPROM, a DRAM, a VRAM, a flash memory, a flash card, a magnetic card, an optical card, nano systems, a molecular memory integrated circuit, a RAID, remote data storage/archive/warehousing, and/or any other type of device suitable for storing instructions and/or data.

Stored on any one of the computer-readable medium or media, instruction store(s), or storage device(s), some implementations include software for controlling both the hardware of the system and for enabling the system or microprocessor to interact with a human user or other mechanism utilizing the results of the embodiments described herein. Such software may include without limitation device drivers, operating systems, and user applications. Ultimately, such computer-readable media or storage device(s) further include software for performing example aspects, as described above.

Included in the programming and/or software of the system are software modules for implementing the procedures described herein. In some example embodiments herein, a module includes software, although in other example embodiments herein, a module includes hardware, or a combination of hardware and software.

While various embodiments of the present disclosure have been described above, it should be understood that they have been presented by way of example, and not limitation. It will be apparent to persons skilled in the relevant art(s) that various changes in form and detail can be made therein. Thus, the above-described example embodiments are not limiting.

The invention claimed is:

1. A method for monitoring a capacitance of a capacitor, the method comprising:

measuring an electrical current supplied from or to the capacitor over time indicated by a plurality of measurement results;

integrating the electrical current to determine a charge amount supplied from or to the capacitor over time indicated by a plurality of integration results;

determining a state of charge (SoC) of the capacitor over time indicated by a plurality of determination results;

determining a total charge capacity of the capacitor based on a linear relationship between changes in the charge amount and changes in the SoC, wherein the total charge capacity indicates a maximum amount of electric charge that can be stored by the capacitor;

determining the capacitance based on the calculated total charge capacity and an open-circuit voltage of the capacitor when fully charged; and outputting the determined capacitance.

2. The method of claim 1, wherein the determining the SoC comprises:

determining a predicted SoC over time based on the charge amount and a nominal charge capacity of the capacitor;

determining an estimated terminal voltage of the capacitor based on the predicted SoC, the electrical current, and an equivalent circuit model of the capacitor;

measuring a terminal voltage of the capacitor; and determining the SoC by correcting the predicted SoC based on the estimated terminal voltage and the measured terminal voltage.

3. The method of claim 2, wherein the equivalent circuit model comprises an internal cell resistance of the capacitor.

4. The method of claim 2, wherein the nominal charge capacity is determined in advance based on one of:

an amount of charge required for changing a terminal voltage of the capacitor between a minimum voltage value and a maximum voltage value; or the total charge capacity determined in a previous iteration of the method.

5. The method of claim 2, wherein the determining the estimated terminal voltage comprises determining an open-circuit voltage of the capacitor over time using a lookup table.

6. The method of claim 2, wherein the determining the estimated terminal voltage comprises measuring a temperature of the capacitor to determine one or more internal cell parameters.

7. The method of claim 2, wherein the correcting of the predicted SoC uses an internal state estimation algorithm.

8. The method of claim 7, wherein the internal state estimation algorithm is a Lueneberger observer algorithm or a Kalman filter algorithm.

9. The method of claim 1, wherein the determining of the total charge capacity comprises performing a least-squares regression based on measurement points associating changes in the charge amount with changes in the SoC.

10. A non-transitory computer readable medium including software code configured to perform the method of claim 1 when the software code is run on a computer processor.

11. A capacitor monitoring device for monitoring the capacitance of a capacitor, the capacitor monitoring device comprising:

a current sensor configured to measure an electrical current supplied from or to the capacitor over time;

a voltage sensor configured to measure a terminal voltage of the capacitor over time;

a capacitance determination unit configured to measure an electrical current supplied from or to the capacitor over time indicated by a plurality of measurement results, integrate the electrical current to determine a charge amount supplied from or to the capacitor over time indicated by a plurality of integration results, determine a state of charge (SoC) of the capacitor over time indicated by a plurality of determination results, determine a total charge capacity of the capacitor based on a linear relationship between changes in the charge amount and changes in the SoC, wherein the total charge capacity indicates a maximum amount of electric charge that can be stored by the capacitor, and determine the capacitance based on the calculated total charge capacity and an open-circuit voltage of the capacitor when fully charged; and an output unit configured to output the determined capacitance.

12. The device of claim 11, wherein the determining the SoC comprises:

determining a predicted SoC over time based on the charge amount and a nominal charge capacity of the capacitor;

determining an estimated terminal voltage of the capacitor based on the predicted SoC, the electrical current, and an equivalent circuit model of the capacitor;

measuring a terminal voltage of the capacitor; and determining the SoC by correcting the predicted SoC based on the estimated terminal voltage and the measured terminal voltage.

13. The device of claim 12, wherein the equivalent circuit model comprises an internal cell resistance of the capacitor.

14. The device of claim 12, wherein the nominal charge capacity is determined in advance based on one of:

an amount of charge required for changing a terminal voltage of the capacitor between a minimum voltage value and a maximum voltage value; or the total charge capacity determined in a previous iteration of the method.

15. The device of claim 12, wherein the determining the estimated terminal voltage comprises determining an open-circuit voltage of the capacitor over time using a lookup table.

16. The device of claim 12, wherein the determining the estimated terminal voltage comprises measuring a temperature of the capacitor to determine one or more internal cell parameters.

17. The device of claim 12, wherein the correcting of the predicted SoC uses an internal state estimation algorithm.

18. The method of claim 17, wherein the internal state estimation algorithm is a Lueneberger observer algorithm or a Kalman filter algorithm.

19. The device of claim 11, wherein the determining of the total charge capacity comprises performing a least-squares regression based on measurement points associating changes in the charge amount with changes in the SoC.

20. A system comprising:

a capacitor; and a capacitor monitoring device according to claim 11.

* * * * *